United States Patent
Zhou et al.

(10) Patent No.: US 11,215,811 B2
(45) Date of Patent: Jan. 4, 2022

(54) DRYING-WETTING SEPARATED FILLING METHOD AND FILLING APPARATUS FOR ELECTROWETTING DISPLAY DEVICE

(71) Applicants: South China Normal University, Guangzhou (CN); Shenzhen Guohua Optoelectronics Co., Ltd., Shenzhen (CN); Academy of Shenzhen Guohua Optoelectronics, Shenzhen (CN)

(72) Inventors: Guofu Zhou, Guangdong (CN); Rui Zhou, Guangdong (CN); Hongwei Jiang, Guangdong (CN); Yuanyuan Guo, Guangdong (CN)

(73) Assignees: SOUTH CHINA NORMAL UNIVERSITY, Guangdong (CN); ACADEMY OF SHENZHEN GUOHUA OPTOELECTRONICS, Guangdong (CN); SHENZHEN GUOHUA OPTOELECTRONICS CO., LTD., Guangdong (CN)

(*) Notice: Subject to any disclaimer, the term of this patent is extended or adjusted under 35 U.S.C. 154(b) by 232 days.

(21) Appl. No.: 16/478,185

(22) PCT Filed: Nov. 15, 2017

(86) PCT No.: PCT/CN2017/110993
§ 371 (c)(1),
(2) Date: Jul. 16, 2019

(87) PCT Pub. No.: WO2018/133515
PCT Pub. Date: Jul. 26, 2018

(65) Prior Publication Data
US 2019/0369384 A1   Dec. 5, 2019

(30) Foreign Application Priority Data
Jan. 22, 2017 (CN) .......................... 201710054237.1

(51) Int. Cl.
*G02B 26/00* (2006.01)
*B05C 11/10* (2006.01)
(Continued)

(52) U.S. Cl.
CPC ........ *G02B 26/005* (2013.01); *B05C 11/1036* (2013.01); *G02B 1/06* (2013.01);
(Continued)

(58) Field of Classification Search
CPC .. G02B 26/005; G02B 1/06; G02B 2207/115; G02B 26/004; G02B 3/14; G02B 26/02;
(Continued)

(56) References Cited

U.S. PATENT DOCUMENTS 9,259,756 B2    2/2016  Gregory et al.
2013/0260045 A1* 10/2013 Yeo ..................... B05C 11/1036
                                                    427/417

FOREIGN PATENT DOCUMENTS

CN    101669060    3/2010
CN    103492928    1/2014
(Continued)

OTHER PUBLICATIONS

International Search Report dated Feb. 13, 2018 for PCT/CN2017/110993.

*Primary Examiner* — Brandi N Thomas
(74) *Attorney, Agent, or Firm* — Gottlieb, Rackman & Reisman, P.C.

(57) ABSTRACT

Disclosed is a drying-wetting separated filling method and a filling apparatus for an electrowetting display device. The filling method comprises filling a non-polar solution into pixel grids on a lower substrate of an electrowetting display device in air, and filling a polar solution to immediately cover the non-polar solution filled after filling the non-polar solution into the pixel grids. Compared with filling the (Continued)

non-polar solution into the polar solution, directly filling the non-polar solution in air has better filling uniformity, easier operation and control. With the method, the fillings of the polar solution and the non-polar solution are easy, having a higher filling efficiency, and no air bubble residue.

9 Claims, 3 Drawing Sheets

(51) Int. Cl.
*G02B 1/06* (2006.01)
*G09G 3/34* (2006.01)
*H01L 21/67* (2006.01)

(52) U.S. Cl.
CPC ......... *G09G 3/348* (2013.01); *H01L 21/6715* (2013.01); *G02B 2207/115* (2013.01)

(58) Field of Classification Search
CPC ........ G02B 7/028; G02B 27/646; G02B 3/02; G02B 3/12; G02B 7/36; G02B 26/007; G02B 5/201; G02B 30/27; G02B 5/0242; G02B 5/3058; G02B 13/0015; G02B 13/0075; G02B 1/04; G02B 1/12; G02B 23/2423; G02B 26/00; G02B 26/04; G02B 26/06; G02B 26/08; G02B 27/0068; G02B 27/0075; G02B 30/25; G02B 30/52; G02B 3/0056; G02B 5/02; G02B 5/20; G02B 5/223; G02B 6/002; G02B 6/0036; G02B 6/0045; B05C 11/1036; B01L 3/502792; B01L 2400/0427; B01L 2300/0816; B01L 2300/0645; B01L 3/502715; B01L 2200/0673; B01L 2200/027; B01L 2200/0605; B01L 2300/161; B01L 3/50273; B01L 2200/0642; B01L 2200/0684; B01L 2300/0809; B01L 2300/165; B01L 2200/025; B01L 2200/0689; B01L 2200/141; B01L 2200/143; B01L 2300/0864; B01L 2300/089; B01L 2400/0406; B01L 2400/0627; B01L 3/502723; B01L 2300/0627; B01L 2300/0663; B01L 2300/0851; B01L 2300/0858; B01L 2300/0887; B01L 3/52707; B01L 2200/10; B01L 2200/12; B01L 2300/02; B01L 2300/047; B01L 2300/06; B01L 2300/0867; B01L 2400/02; B01L 2400/0487; B01L 2400/0688; B01L 3/0217

See application file for complete search history.

(56) References Cited

FOREIGN PATENT DOCUMENTS

| | | |
|---|---|---|
| CN | 103676137 | 3/2014 |
| CN | 106773017 | 5/2017 |
| WO | 2008125644 | 10/2008 |

* cited by examiner

DRYING-WETTING SEPARATED FILLING METHOD AND FILLING APPARATUS FOR ELECTROWETTING DISPLAY DEVICE

This application is the U.S. National Stage application of PCT/CN2017/110993 filed Nov. 15, 2017, which claims priority to CN application 201710054237.1 filed on Jan. 22, 2017.

TECHNICAL FIELD

The present disclosure relates to the field of electrowetting display technologies, and more particularly, to a drying-wetting separated filling method and filling apparatus for an electrowetting display device.

BACKGROUND

So-called wetting refers to a process in which one fluid on a solid surface is replaced by another fluid. A liquid can be spread on the solid surface, and a solid-liquid contact surface has a tendency to expand, that is, an adhesive force of the liquid to the solid surface is greater than a cohesive force thereof, i.e., wetting. The liquid cannot be spread on the solid surface, and the contact surface has a tendency to shrink into a sphere, which is non-wetting, and the non-wetting refers to that the cohesive force of the liquid to the solid surface is less than the adhesive force thereof. An electrowetting display device uses an electrowetting principle to change a wettability of an electrolyte solution on a surface of a hydrophobic insulating layer by applying a voltage, thus driving shrinking and spreading states of another non-polar solvent to realize a display effect. An electrowetting display technology was first invented by Robert A. Hayes et al. and published on Nature in 2003.

As shown in FIG. 1, a basic structure of the electrowetting device is composed of upper and lower substrates, and two immiscible polar solution 4 and non-polar solution 5 filled in a sealed cavity formed by the two substrates oppositely arranged, and the lower substrate comprises a lower support plate 9, a first electrode 8, a hydrophobic insulating layer (or an insulating layer coated with a hydrophobic material on a surface) 7 and a pixel wall 6. The upper substrate comprises an upper support plate 1, a second electrode 2 and a sealant 3. An area between the pixel walls 6 is a display area, a hydrophobicity of a material of the pixel wall 6 is lower than the hydrophobicity of the hydrophobic insulating layer 7, a wettability of the polar solution 4 is different from a wettability of the non-polar solution 5 on the surface of the pixel wall 6, and the wettability of the polar solution 4 on the surface of the pixel wall 6 is better, so that the non-polar solution 5 can be controlled to be filled in each pixel grid and the non-polar solution 5 in each pixel is separated due to the hydrophilicity of the pixel wall 6.

There are two liquids of the polar solution 4 and the non-polar solution 5 in the electrowetting display device, and the two liquids are immiscible. Due to this special structure, neither a vacuum filling method nor an ODF of a liquid crystal display is suitable for liquid material filling of the electrowetting device. At present, a main filling method of the electrowetting display device comprises a Liquavista liquid-separation filling method, a vertical immersion filling method of University of Cincinnati, etc.

The Liquavista liquid-separation filling method is to fill the non-polar solution in a polar electrolyte solution environment, the lower substrate with a pixel structure is placed in the polar electrolyte solution environment, a device with a liquid-separation structure is used in the filling of the non-polar solution, a main portion of the device is a groove, a top end of the groove is connected with a gas filling channel and a liquid filling channel, the specific structure is similar to slit coating, the device is made of hard organic glass material, an opening of the groove of the device faces the substrate, a length of the groove depends on a width of a display panel, and a width of the groove is generally 0.1 mm to 0.2 mm. When the non-polar solution is filled, the device is placed in the polar electrolyte solution environment and a distance between the device and the lower substrate is kept at 100 p.m. Air is filled into the groove through an air filling port to form a stable air bubble before filling, and the air bubble is contacted with the lower substrate. Then, the non-polar liquid is filled into the groove through the liquid filling channel, and the non-polar solution is distributed along an edge of the air bubble. Then, liquid-separation equipment is controlled to move back and forth to realize the filling of the non-polar solution. The Liquavista liquid-separation filling method realizes uniform filling by adjusting a ratio of the air bubble and the non-polar solution in the groove. A filling key in this method lies in that the non-polar solution replaces a position of the air bubble to be filled into the pixel grid while the residual air bubble in the pixel grid is taken away in the moving process of the air bubble in the groove. Therefore, the continuity and the uniformity of the air bubble and the non-polar solution in the groove play crucial roles in filling the device, and if the air bubble in the groove is incomplete, the residual air bubble in partial pixel grids cannot be removed, thus the non-polar solution cannot be filled. If the distribution of the non-polar solution in the groove is incomplete, the pixel grid is failed because the polar electrolyte solution replaces the position of the air bubble while the air bubble in the pixel grid is removed. Therefore, this method can only be applied to a small-sized electrowetting display device. In addition, an optimal moving speed of a liquid separator is 1 μm/s, the filling speed is slow, and mass production is difficult. Moreover, a Liquavista self-assembly filling method needs to accurately control an amount of ink, otherwise the ink filling nonuniformity in different areas of the display device can be caused due to different amounts of ink during filling, and meanwhile, a stable air-ink interface needs to be maintained in the electrolyte solution, thus the process is relatively difficult.

The vertical immersion method of the University of Cincinnati is to put the polar electrolyte solution into a suitable container, and a size of the container and a height of the polar electrolyte solution shall be sufficient, so that the entire substrate can be completely immersed. Then, the non-polar solution is added to form a non-polar solution layer on the polar electrolyte solution equivalent to a thickness of several pixel sizes, the lower substrate is vertically fixed on a dip coating machine, the lower substrate is vertically inserted into the container at a speed of 0.5 mm/s, and the hydrophobic non-polar solution based on the hydrophobic insulating layer can be spread on a bottom of the pixel to form a uniform non-polar solution layer. When the lower substrate passes through the non-polar solution layer in the container, because the pixel wall is hydrophilic, the continuity of the non-polar solution on the substrate can be blocked, thus forming pixel points filled with the non-polar solution one by one. The vertical immersion method of the University of Cincinnati requires a large amount of ink and accurate control over the amount of ink because a layer of ink film with a fixed thickness needs to be formed in the container, and meanwhile, due to a volatility of an ink solvent, a concentration uniformity of the ink in the filling process cannot be ensured, and a filling amount of the ink in a pixel structure cannot be accurately controlled. Meanwhile, the filling speed of the method is 0.5 mm/s, and the filling speed is slower.

All the filling methods of the common electrowetting display device above require to be performed in the electrolyte solution, manufacturing processes of components such as a filling tool head are relatively complicated, and an air-ink two-phase interface needs to be stabilized in the electrolyte solution, which is difficult to be accurately and stably controlled. Moreover, these existing electrowetting display devices mainly have the following problems during filling: slow filling speed, poor uniformity, waste of ink, filling in an electrolyte solution environment, influence by electrolyte level fluctuation, difficult operation, and disadvantage of mass production.

SUMMARY

The object of the invention is to provide a drying-wetting separated filling method and a filling apparatus for an electrowetting display device.

The filling method for an electrowetting display device of the invention comprises the following steps:

S1: filling a non-polar solution into pixel grids on a lower substrate of an electrowetting display device, in air; and S2: after filling the non-polar solution into the pixel grids, filling a polar solution to immediately cover the non-polar solution filled.

In some preferred embodiments, the non-polar solution is filled into the pixel grids column by column in air along a longitudinal direction of the pixel grids by a scraper having a liquid filling channel inside, and the scraper moves along a transverse direction of the pixel grids to complete the filling of the non-polar solution in each of the columns of the pixel grids.

In some further preferred embodiments, the polar solution is filled at a side of the scraper where the non-polar solution is already filled, such that the polar solution can immediately cover the non-polar solution filled while the scraper is moving.

In some further preferred embodiments, a liquid level of the polar solution at the side where the non-polar solution is already filled is controlled to remain stable.

The filling apparatus for carrying out the filling method for an electrowetting display device according to the invention comprises a cofferdam and a scraper arranged in the cofferdam, wherein the scraper is provided with a liquid filling channel inside, and the scraper is movable backward and forward along a direction; while the scraper is moving, a dynamic sealing is formed between two ends of the scraper and two opposite inner walls of the cofferdam, such that a peripherally sealed filling area is formed at a side of the scraper.

In some preferred embodiments, the scraper has an upward concaved bottom forming an oil storage tank, the oil storage tank is communicated with the liquid filling channel, and extends along a length direction of the scraper.

In some further preferred embodiments, the liquid filling channel extends to a bottom of the scraper.

In some further preferred embodiments, the scraper has a plurality of micro printing heads at a bottom thereof, and the micro printing heads are communicated with the liquid filling channel.

In some further preferred embodiments, the filling apparatus further comprises sealing strips arranged at the two ends of the scraper, wherein the sealing strips are contacted with the inner walls of the cofferdam, and bottoms of the sealing strips are flush with a bottom of the cofferdam.

In some further preferred embodiments, the filling apparatus further comprises strip-like sealing strips arranged at the two opposite inner walls of the cofferdam, wherein bottoms of the strip-like sealing strips are flush with the cofferdam, and the two ends of the scraper are kept in contact with the strip-like sealing strips while the scraper is moving.

In some further preferred embodiments, the filling apparatus further comprises a water-insoluble sealing material coated on the two opposite inner walls of the cofferdam, wherein the two ends of the scraper are kept in contact with the sealing material while the scraper is moving.

The present disclosure provides a drying-wetting separated filling method and a filling apparatus for an electrowetting display device. According to the invention, firstly, the non-polar solution is filled into the pixel grids on the lower substrate of the electrowetting display device in air; and then, after the non-polar solution is filled into the pixel grids, the polar solution is filled to immediately cover the filled non-polar solution. Through a large number of experiments, it is found that, compared with filling the non-polar solution into the polar solution, directly filling the non-polar solution in air have better filling uniformity and easier operation and control. Moreover, with a Liquavista liquid-separation filling method, controlling of the proportion of the air bubble and the non-polar solution is needed for uniform filling, and thus, its filling speed is low, readily causing a dead pixel of the device due to a residual air bubble in the pixel grid. However, in the present disclosure, the filling of the non-polar solution is conducted directly in an air environment, and the polar solution is filled from the side of the pixel grids where the non-polar solution is already filled, it is easy and no air bubble is residual. The filling method according to the present disclosure has a fast filling speed up to 6 cm/s, and a higher filling efficiency, and thus is very suitable for industrialized production of the electrowetting display devices. A vertical filling method by University of Cincinnati and the Liquavista liquid-separation filling method both require a large amount of polar electrolyte solution. If an ionic liquid is used as the polar electrolyte solution, its loss rate will be excessive and the filling cost will be relatively high. However, with the filling method according to the present disclosure, the consumption of the polar electrolyte solution can be greatly reduced, consequently, the cost of the electrowetting display device for which the ionic liquid of higher price is used as the polar electrolyte solution can be reduced. In other words, the present invention makes the use of the ionic liquid in the electrowetting display device possible. The present disclosure further provides the filling apparatus for carrying out the method, the cofferdam is arranged on the lower substrate of a pixel grid structure, the non-polar solution is filled into the pixel grids by the scraper having the liquid filling channel inside, the peripherally sealed filling area is formed at a side of the scraper by the scraper and the cofferdam. The polar solution is filled into the sealed space, to immediately cover the non-polar solution.

DETAILED DESCRIPTION

First Embodiment

Figure 1:
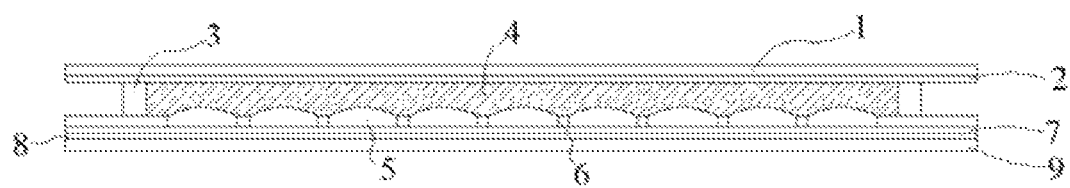
FIG. 1 is a sectional view of an electrowetting display device.
Figure 2:
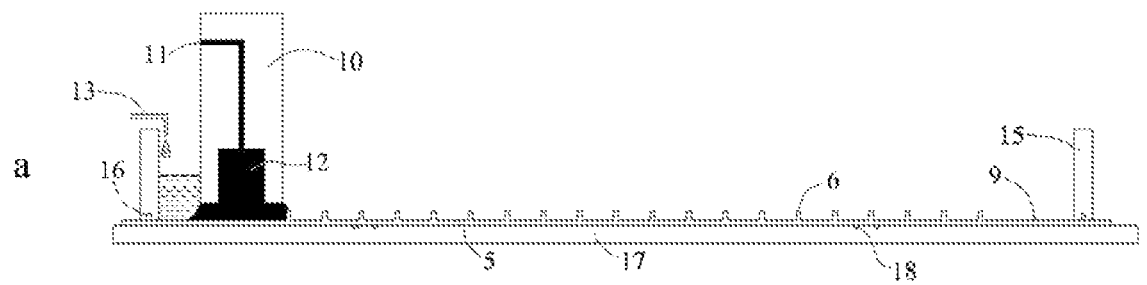
FIG. 2 is a diagram illustrating a filling process for the electrowetting display device.
Figure 2:
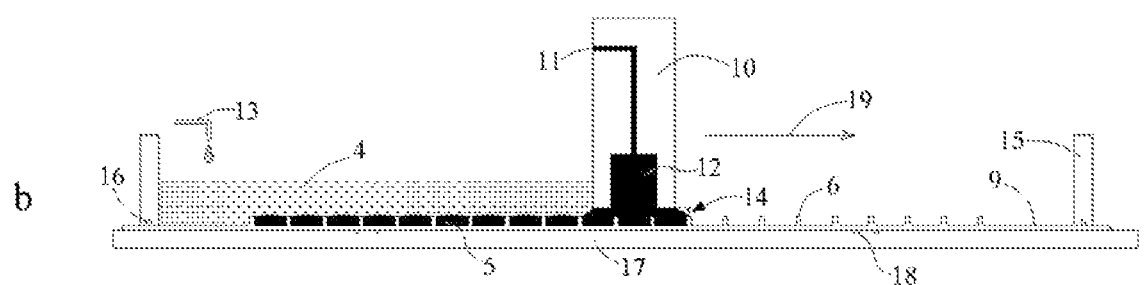
Figure 2:
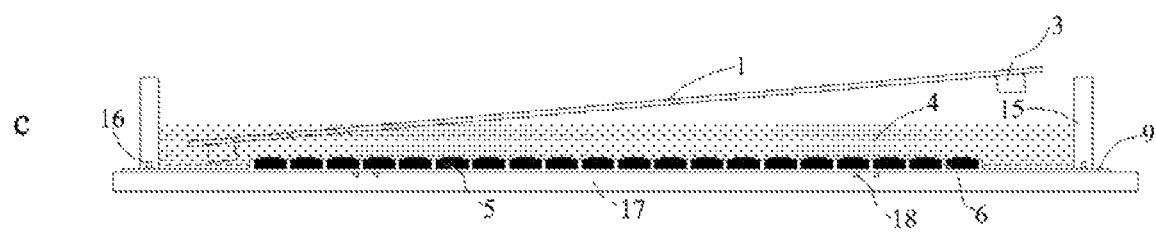

With reference to FIG. 2, in which a diagram illustrates a filling process for an electrowetting display device, the present disclosure provides a filling method for the electrowetting display device. The method of the invention comprises the following steps: filling a non-polar solution into pixel grids on a lower substrate of the electrowetting display device, in air; and after filling the non-polar solution into the pixel grids, filling a polar solution therein to immediately cover the filled non-polar solution. In a preferred embodiment, the non-polar solution 5 is filled into the pixel grids column by column in air, along a longitudinal direction of the pixel grids, by means of a scraper 10 which has a liquid filling channel 11 inside, as shown in FIG. 2b. The scraper 10 is controlled to move along a transverse direction with respect to the pixel grids, at a constant speed within a speed range of 0.5 cm/s to 0.6 cm/s, allowing the speed of filling the non-polar solution 5 into the pixel grids by the liquid filling channel 11 in the scraper 10 to be kept constant. While the filling of the non-polar solution 5 into each of the columns of pixel grids is completed, the polar solution 4 is filled into one side of the scraper 10 where the non-polar solution 5 is already filled, such that, the polar solution 4 can immediately cover the filled non-polar solution 5 while the scraper 10 is moving. By controlling the filling speed of the polar solution 4 according to the moving speed of the scraper 10, the polar solution 4 in the side where the non-polar solution 5 is already filled can be ensured to have a consistent liquid level. With the filling method, by controlling the filling speed of the polar solution 4 and the moving speed of the scraper 10, it is easy to keep the liquid level of the polar solution 4 stable, and thus the uneven filling of the non-polar solution 5 caused by fluctuation of the liquid level of the polar solution 4 can be well avoided.

With a conventional filling method, the filling is extremely vulnerable to the vibration of the polar solution, as the vibration of the polar solution may cause uneven fillings of the non-polar solution among different pixel grids. Moreover, with the conventional filling method, it is difficult to accurately control the volume of the non-polar solution on a liquid surface and a three-phase interface line during the filling process, this may also cause uneven fillings of the non-polar solution among different areas. However, with the present invention, the volume of the non-polar solution can be accurately controlled by a filling tool head, so that an even thickness of the non-polar solution in the filling area can be readily achieved. With the conventional filling method, as the filling of the non-polar solution into the pixel grids completely relies on the absorptivity of a hydrophobic insulating layer to the non-polar solution, the thickness of the non-polar solution in the pixel grids relies to a large extent on the properties of the hydrophobic insulating layer. Therefore, the thickness is not adjustable. However, according to the present disclosure, the filling thickness of the non-polar solution can be controllable in a certain range according to a filling spacing and a coating speed.

It can be seen from FIG. 2 that, in the present disclosure a filling apparatus for carrying out the filling method for the electrowetting display described above is provided. The filling apparatus comprises a cofferdam 15 and a scraper 10 arranged in the cofferdam 15, wherein the scraper 10 is provided with a liquid filling channel 11 inside. The scraper 10 can move backward and forward along a direction. While the scraper 10 is moving, a dynamic sealing is formed between two ends of the scraper 10 and two opposite inner walls of the cofferdam 15, and thus a peripherally sealed filling area is formed at one side of the scraper 10. The cofferdam 15 is placed on a lower support plate 9 having a pixel wall 6. The cofferdam 15 can be a peripherally sealed cofferdam, or a cofferdam with one side opened and other sides sealed. In the embodiment, the lower support plate 9 is placed on a working platform 17, the cofferdam 15 is a peripherally sealed square cofferdam, and the cofferdam 15 peripherally surrounds the pixel wall 6. In the embodiment, the cofferdam 15 is provided with a communicated or intermittent vacuum groove 16 on a contact surface thereof with the lower support plate 9, and the working platform 17 is provided with a vacuum adsorption device 18, thus the cofferdam 15 is adsorbed on the lower support plate 9 by vacuum-pumping for a sealing connection between a bottom of the cofferdam 15 and the lower support plate 9. In other embodiments, the cofferdam 15 can be pressed on the lower support plate 9 by a pressure device, or the cofferdam 15 can be adhesively fixed on the lower support plate 9 by a sealant. The dynamic sealing is always formed between the two ends of the scraper 10 and the two opposite inner walls of the cofferdam 15, to form a peripherally sealed filling area at a reverse side of the scraper 10 with respect to the advancing direction of the scraper 10, i.e., a peripherally sealed filling area at the left side of the scraper 10 as shown in FIG. 2. A spacing between the scraper 10 and a top of the pixel wall 6 is controlled to form a peripherally sealed filling space at the reverse side of the scraper 10 with respect to the advancing direction of the scraper 10 by the scraper 10 and the cofferdam 15, during the process of filling the non-polar solution 5. The polar solution 4 is filled into the filling space by means of a polar solution adding device 13, while the non-polar solution 5 is filled into the pixel grids, and after the non-polar solution is filled into the pixel grids, the polar solution 4 is filled to immediately cover the filled non-polar solution 5.

It can be seen from FIGS. 2a, 2b and 2c that, as the scraper 10 is moving continuously to the right along a moving direction 19, the liquid level of the polar solution 4 in the filling area at the left side must be controlled to remain consistent, so as to prevent the liquid level fluctuation of the polar solution 4 from affecting the filling of the non-polar solution 5, thereby ensuring the even filling of the non-polar solution 5. With reference to FIG. 2c, it can be seen that, while the fillings of the non-polar solution 5 and the polar solution 4 are completed, an upper support plate 1 with the sealant 3 is placed into the polar solution 4 at a certain angle, to align and bond the upper and lower substrates, thereby to complete a packaging process of the electrowetting display device. If the cofferdam 15 is the peripherally sealed cofferdam, the scraper 10 can be lifted to package the upper and lower substrates, while the fillings of the non-polar solution 5 and the polar solution 4 are completed. If the cofferdam 15 is the cofferdam with one side opened and other sides sealed, the scraper 10 and the cofferdam 15 can be remained to form the sealed filling space, and the upper and lower substrates are directly packaged at the left side of the scraper 10.

Figure 3:
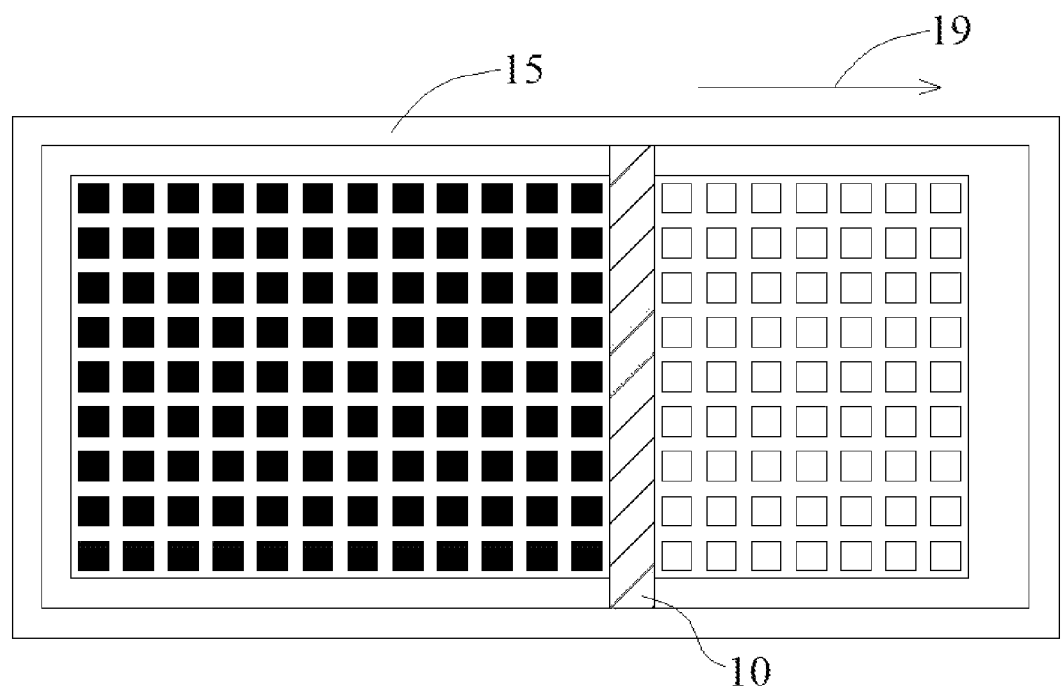
FIG. 3 is a top view of the electrowetting display device during the filling process.

With reference to FIG. 3, it is a top view of the electrowetting display device in the filling process. It can be seen that, the cofferdam 15 is the peripherally sealed square cofferdam, the cofferdam 15 surrounds the periphery of the pixel wall 6, the dynamic sealing is formed between the two ends of the scraper and the two opposite inner walls of the cofferdam 15, and thus the peripherally sealed filling area is formed at one side of the scraper 10. The scraper 10 moves in the moving direction 19, i.e. in a transverse direction of the pixel grid, and the non-polar solution 5 is filled into the pixel grids column by column in air, along a longitudinal direction of the pixel grids.

Figure 4:
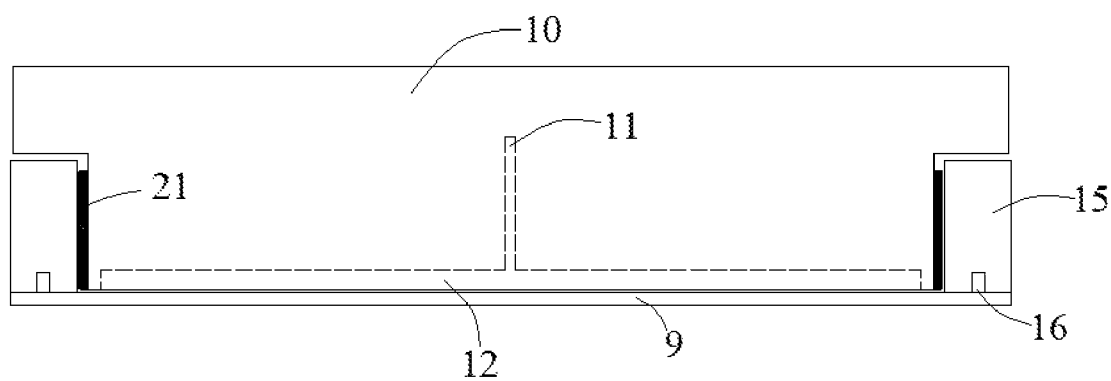
FIG. 4 is a front view of a scraper in a first embodiment.

With reference to FIG. 4, which is a front view of the scraper in the first embodiment, the scraper 10 has an upward concaved bottom forming an oil storage tank 12. The oil storage tank 12 is communicated with the liquid filling channel 11, extends along a length direction of the scraper 10, and has a length relying on a width of the display area of the lower support plate 9. The scraper 10 can be made of organic materials, such as hard organic glass and polycarbonate, or metal materials, such as aluminum alloy and stainless steel. The two ends of the scraper 10 are embedded with sealing strips 21 which are contacted with the inner walls of the cofferdam 15, a distance between the sealing strips 21 and the inner walls of the cofferdam 15 is 0, and bottoms of the sealing strips are flush with the bottom of the cofferdam 15. Tops of the sealing strips 21 cannot be lower than the liquid level of the polar solution 4 in filling. The sealing strips 21 can be made of polyurethane rubber or silicone rubber. The sealing strips 21 can have a square or cylindrical cross-sectional shape, and can be any other sealing strips with the same function.

Figure 5:
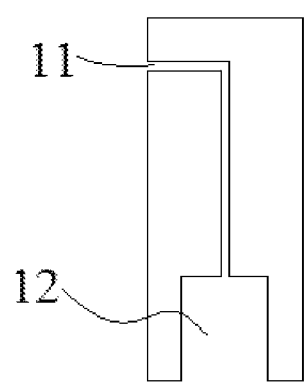
FIG. 5 is a left view of the scraper in the first embodiment.
Figure 6:
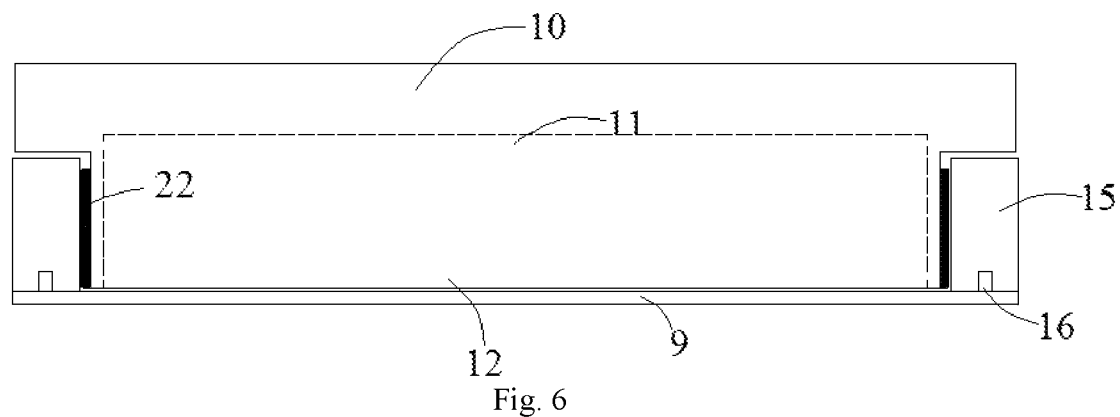
FIG. 6 is a front view of the scraper in a second embodiment.
Figure 7:
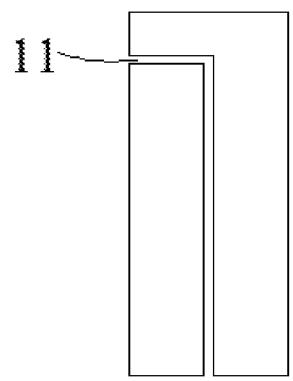
FIG. 7 is a left view of the scraper in the second embodiment.
Figure 8:
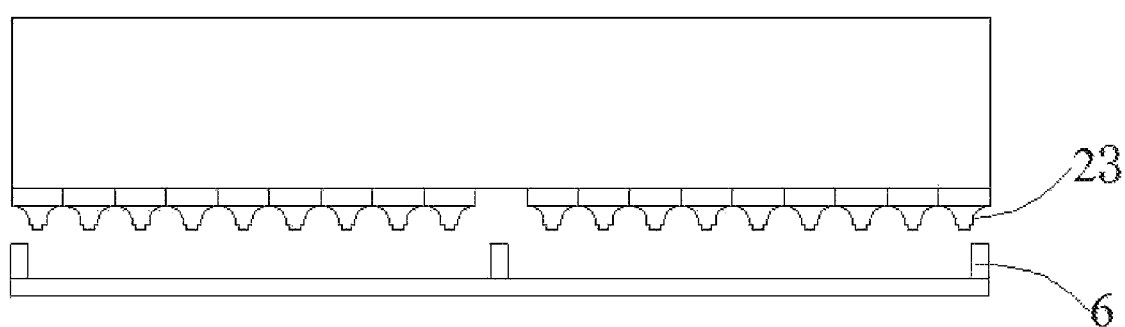
FIG. 8 is a front view of the scraper in a third embodiment.

With reference to FIG. 5, which is a left view of the scraper in the first embodiment, the oil storage tank 12 can have a rectangular or arc or the like cross-section shape, the non-polar solution 5 is filled into the oil storage tank 12 through the liquid filling channel 11, and the oil storage tank 12 is fully filled. The non-polar solution 5 is spread inside the oil storage tank 12, the non-polar solution 5 in the oil storage tank 12 is contacted with the pixel wall 6, and a filling distance 14 between the bottom of the scraper 10 and the top of the pixel wall 6 can be controlled within 10-300 μm.

Second Embodiment

In the embodiment, another filling apparatus for an electrowetting display device is provided, which is basically the same as it of the first embodiment, except that: the cofferdam 15 are provided with strip-like sealing strips 22 at two opposite inner walls thereof, bottoms of the strip-like sealing strips are flush with the cofferdam 15, and tops of the strip-like sealing strips 22 cannot be lower than the liquid level of the polar solution 4 in filling. The two ends of the scraper 10 are kept in contact with the strip-like sealing strips 22 while the scraper 10 is moving, so that distances respectively between the strip-like sealing strips 22 and left and right sides of the scraper 10 are zero. The strip-like sealing strips 22 can have a square, circular arc or other polygonal cross-section shape, and the left and right sides of the scraper 10 need to be processed into a structure that can be completely matched with the cross-section shape of the strip-like sealing strips 22. The strip-like sealing strips 22 run through the entire length of the inner walls of the cofferdam 15. The strip-like sealing strips 22 can be made of polyurethane rubber or silicone rubber. Only the liquid filling channel 11 is arranged inside the scraper 10, the liquid filling channel 11 penetrates through the bottom of the scraper 10, and extends along a length direction of the scraper 10. The filling distance between the scraper 10 and the top end of the pixel wall 6 is controlled within 10-100 μm.

Third Embodiment

In the embodiment another filling apparatus for an electrowetting display device is provided, which is basically the same as it of the first embodiment, except that: the scraper 10 is provided with a plurality of micro printing heads 23 at the bottom thereof, the micro printing heads 23 are communicated with the liquid filling channel which is not shown in the drawings. Each of the pixel grids can correspond to a plurality of micro printing heads 23, the non-polar solution 5 can be directly filled into the pixel grids through program control, and the filling distance between the micro printing heads 23 and a top end of the pixel wall 6 can be controlled within 10 μm to 75 μm. The scraper 10 consisting of the array-type micro printing heads 23 can fill the non-polar solutions 5 of different colors into the pixel grids according to need, thereby to realize full color display. The two opposite inner walls of the cofferdam 15 are coated with water-insoluble sealing materials, and the two ends of the scraper 10 are kept in contact with the sealing materials while the scraper 10 is moving. The sealing materials can be high viscosity sealing materials, such as Vaseline or sealing silicone grease.

The invention claimed is:

1. A filling method for an electrowetting display device, comprising the following steps:
    S1: filling a non-polar solution into pixel grids on a lower substrate of an electrowetting display device, in air, wherein, the non-polar solution is filled into the pixel grids, column by column, in air along a longitudinal direction of the pixel grids by a scraper having a liquid filling channel inside, with the scraper moving along a transverse direction of the pixel grids to complete the filling of the non-polar solution in each of the columns of the pixel grids; and
    S2: after filling the non-polar solution into the pixel grids, filling a polar solution to immediately cover the non-polar solution wherein a filling speed of the polar solution is controlled according to a moving speed of the scraper.

2. The filling method for an electrowetting display device according to claim 1, wherein, in S2, the polar solution is filed at a side of the scraper where the non-polar solution is already filed, such that the polar solution can immediately cover the non-polar solution filed while the scraper is moving.

3. The filling method for an electrowetting display device according to claim 2, wherein, a liquid level of the polar solution at the side where the non-polar solution is already filled is controlled to remain stable.

4. A filling apparatus for carrying out the filling method for an electrowetting display device according to claim 1, comprising a cofferdam and a scraper arranged in the cofferdam, wherein the scraper is provided with a liquid filling channel inside, and the scraper is movable backward and forward along a direction;
    while the scraper is moving, a dynamic sealing is formed between two ends of the scraper and two opposite inner walls of the cofferdam, such that a peripherally sealed filling area is formed at a side of the scraper.

5. The filling apparatus according to claim 4, wherein the scraper has an upward concaved bottom forming an oil storage tank, the oil storage tank is communicated with the liquid filling channel, and extends along a length direction of the scraper.

6. The filling apparatus according to claim 4, wherein the scraper has a plurality of micro printing heads at a bottom thereof, and the micro printing heads are communicated with the liquid filling channel.

7. The filling apparatus according to claim 4, further comprising sealing strips arranged at the two ends of the scraper, wherein the sealing strips are contacted with the inner walls of the cofferdam, and bottoms of the sealing strips are flush with a bottom of the cofferdam.

8. The filling apparatus according to claim 4, further comprising strip-like sealing strips arranged at the two opposite inner walls of the cofferdam, wherein, bottoms of the strip-like sealing strips are flush with the cofferdam, and the two ends of the scraper are kept in contact with the strip-like sealing strips while the scraper is moving.

9. The filling apparatus according to claim 4, further comprising a water-insoluble sealing material coated on the two opposite inner walls of the cofferdam, wherein the two ends of the scraper are kept in contact with the sealing material while the scraper is moving.

\* \* \* \* \*